United States Patent
Nemoz et al.

(10) Patent No.: US 8,000,096 B2
(45) Date of Patent: Aug. 16, 2011

(54) COMPUTER WITH SIMPLIFIED LAYOUT, DESIGNED FOR AVIATION

(75) Inventors: Gérard Nemoz, Maisons-Alfort (FR); Philippe Bieth, Saclay (FR)

(73) Assignee: Thales, Neuilly Sur Seine (FR)

( * ) Notice: Subject to any disclaimer, the term of this patent is extended or adjusted under 35 U.S.C. 154(b) by 150 days.

(21) Appl. No.: 12/415,074

(22) Filed: Mar. 31, 2009

(65) Prior Publication Data
US 2009/0244831 A1 Oct. 1, 2009

(30) Foreign Application Priority Data
Apr. 1, 2008 (FR) ...................... 08 01788

(51) Int. Cl.
*H05K 7/00* (2006.01)
(52) U.S. Cl. ................ 361/679.32; 361/679.4; 361/726; 361/796; 439/61; 439/67; 312/223.1; 385/24
(58) Field of Classification Search ............. 361/679.33, 361/679.46, 679.49, 690, 692, 694, 695, 361/724, 726, 727, 752, 796, 633, 640, 679.02, 361/679.31, 679.32, 679.34, 679.37, 679.4, 361/715, 717, 719–722, 725, 730, 732, 736
See application file for complete search history.

(56) References Cited

U.S. PATENT DOCUMENTS

| | | | | |
|---|---|---|---|---|
| 5,063,475 A | * | 11/1991 | Balan | 361/679.49 |
| 5,497,288 A | * | 3/1996 | Otis et al. | 361/679.46 |
| 5,751,549 A | * | 5/1998 | Eberhardt et al. | 361/679.33 |
| 6,532,154 B2 | * | 3/2003 | Eady et al. | 361/719 |
| 6,728,104 B1 | * | 4/2004 | Ahmad et al. | 361/704 |
| 6,997,720 B2 | * | 2/2006 | Perret et al. | 439/67 |
| 7,352,576 B2 | * | 4/2008 | McClure | 361/695 |
| 7,773,382 B2 | * | 8/2010 | Kingston et al. | 361/719 |
| 2006/0126292 A1 | * | 6/2006 | Pfahnl et al. | 361/695 |
| 2006/0221579 A1 | * | 10/2006 | Liang et al. | 361/724 |
| 2007/0238326 A1 | * | 10/2007 | Fallah-Adl et al. | 439/67 |
| 2008/0026637 A1 | * | 1/2008 | Minich | 439/608 |

FOREIGN PATENT DOCUMENTS
FR 2 900 506 11/2007
JP 2000 123892 4/2000
* cited by examiner

*Primary Examiner* — Jayprakash N Gandhi
*Assistant Examiner* — Courtney Smith
(74) *Attorney, Agent, or Firm* — Lowe Hauptman Ham & Berner, LLP

(57) ABSTRACT

The present invention belongs to the field of reduced-dimension computers of the ARINC 600 computer type of small and medium dimensions. The advantage of the invention is that it allows optimization of use of the volume of the computers. The surface area for accommodating electronic components on one board is greatly increased and the heat control is made easier and better.

14 Claims, 5 Drawing Sheets

COMPUTER WITH SIMPLIFIED LAYOUT, DESIGNED FOR AVIATION

RELATED APPLICATIONS

The present application is based on, and claims priority from, French Application Number 08 01788, filed Apr. 1, 2008, the disclosure of which is hereby incorporated by reference herein in its entirety.

FIELD OF THE INVENTION

The present invention belongs to the field of reduced-dimension computers, of the ARINC 600 computer type, mainly with 3 MCU dimensions.

BACKGROUND OF THE INVENTION

ARINC 600 computers satisfy a standard format for aviation equipment of the same name, created by the company ARINC (for "Aeronautical Radio, INCorporated"). MCU (for "Modular Component Unit") constitutes a standard width for "rack" equipment, widely used in the aviation industry notably. This width may be from 1 to 12 MCU.

The prior art of the current generation of computers usually consists, for an ARINC 600 module of all dimensions, in containing N boards, and more particularly three or four boards, inserted perpendicularly to a "backplane" printed circuit secured to the connection technology situated on the back face of the computer.

Today, in the case of a 3 MCU computer, such an assembly has a developed surface for accommodating electronic components of approximately 28 square decimeters, or four boards comprising components on each of their faces. That represents power to be dissipated of approximately 45 watts, or 15 watts per MCU in power density and approximately 1.6 watts per square decimeter with an additional limitation of maximum local one-off power of approximately 5 to 7 watts.

Furthermore, certain recent changes in integration capacity and in digital processing power make it possible both to reduce the board surface area necessary for the electronics while continuing to increase the processing capacity thereof. Moreover, these changes make it necessary to dissipate more power, to a factor of 3 to 4 in volume and up to more than 5 to 8 in local one-off power within the future computers and, all the more, cause an increase in the surface power density of the circuit boards and in the power density of the computers of the order of 3 to 4.

In this context, the problem raised by the present patent application lies in optimizing the use of the volume of the computers while taking account of the changes mentioned above.

Therefore, the current computers have, on the one hand, the defect of not making it possible to optimize the available surface area for the electronic components as a function of the volume of the computer. The ratio between the volume of the computer and the volume available for dissipating power within the said computer is not optimized either. Furthermore, they impose limited heights for heat-exchange elements such as radiators, because the boards must slide relative to one another on a parallel plane for them to be inserted or extracted from the computer.

The basic idea of the invention is therefore to make use of the changes made in the electronics field to design more efficient computers, notably thanks to a more judicious layout. The invention therefore seeks to make maximum use of the volumes in three dimensions in order to allow the insertion of radiators of considerable height while maintaining the aspects relating to the independently removable boards.

SUMMARY OF THE INVENTION

For this purpose, the subject of the invention is a computer comprising a mechanical, metallic or composite structure, comprising a "backplane" printed circuit situated inside the mechanical structure and having at least one connector designed for the connection of at least one circuit board also present in the computer, wherein the connector comprises means for ensuring the connection of the circuit board on a connection plane parallel to the "backplane" printed circuit of the computer, the said connection plane being parallel to the direction of insertion of the said circuit board, and the said connector being oriented towards the outside of the computer relative to the "backplane" printed circuit and in that the said circuit board has an appropriate connector technology allowing it to be connected to the connector of the "backplane" printed circuit on the connection plane, the latter being orthogonal to the said circuit board in the inserted position.

In an exemplary application of the invention, the "backplane" printed circuit comprises two connectors oriented towards the outside of the computer relative to the "backplane" printed circuit and allowing the connection of two circuit boards closing the computer and the mechanical structure like two end panels.

Advantageously, the top and bottom faces of the computer comprise ventilation orifices.

Advantageously, the circuit board is attached to a shoulder secured to the mechanical structure.

Advantageously, a considerable contact surface area exists between the circuit board and the mechanical structure ensuring, an effective thermal coupling between the said circuit board and the said mechanical structure.

In one exemplary embodiment of the invention, two covers seal the assembly while closing the computer at the lateral faces.

Advantageously, a tools interface can be inserted between the connector of the "backplane" printed circuit and the circuit board, allowing the computer to be opened "butterfly-style".

Advantageously, the elements for cooling the circuit board may occupy the volume available in the centre of the computer.

For example, the elements for cooling the circuit board are radiators that are able to be supplemented by elements for stirring air of the fan type, in the same volume, in order to enhance the effectiveness of the said radiators.

In another exemplary embodiment of the invention, the elements for cooling the circuit board are heat ducts connected to a heat exchanger situated on the front face.

Advantageously, the computer according to the invention may also comprise a power supply board placed in the heart of the computer and allowing the circuit boards to be supplied with voltage, the said voltage travelling only once through the "backplane" printed circuit allowing reduced electric wiring.

In the most common exemplary embodiment, the computer according to the invention has a parallelepipedal shape, comprising front, back, top and bottom faces and two lateral faces.

Preferably, the computer according to the invention has reduced dimensions of reduced width, compatible with an arrangement with board insertion from the side, having, as an example, a width of approximately 9 centimeters in the case of a 3 MCU computer.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

Figure 1:
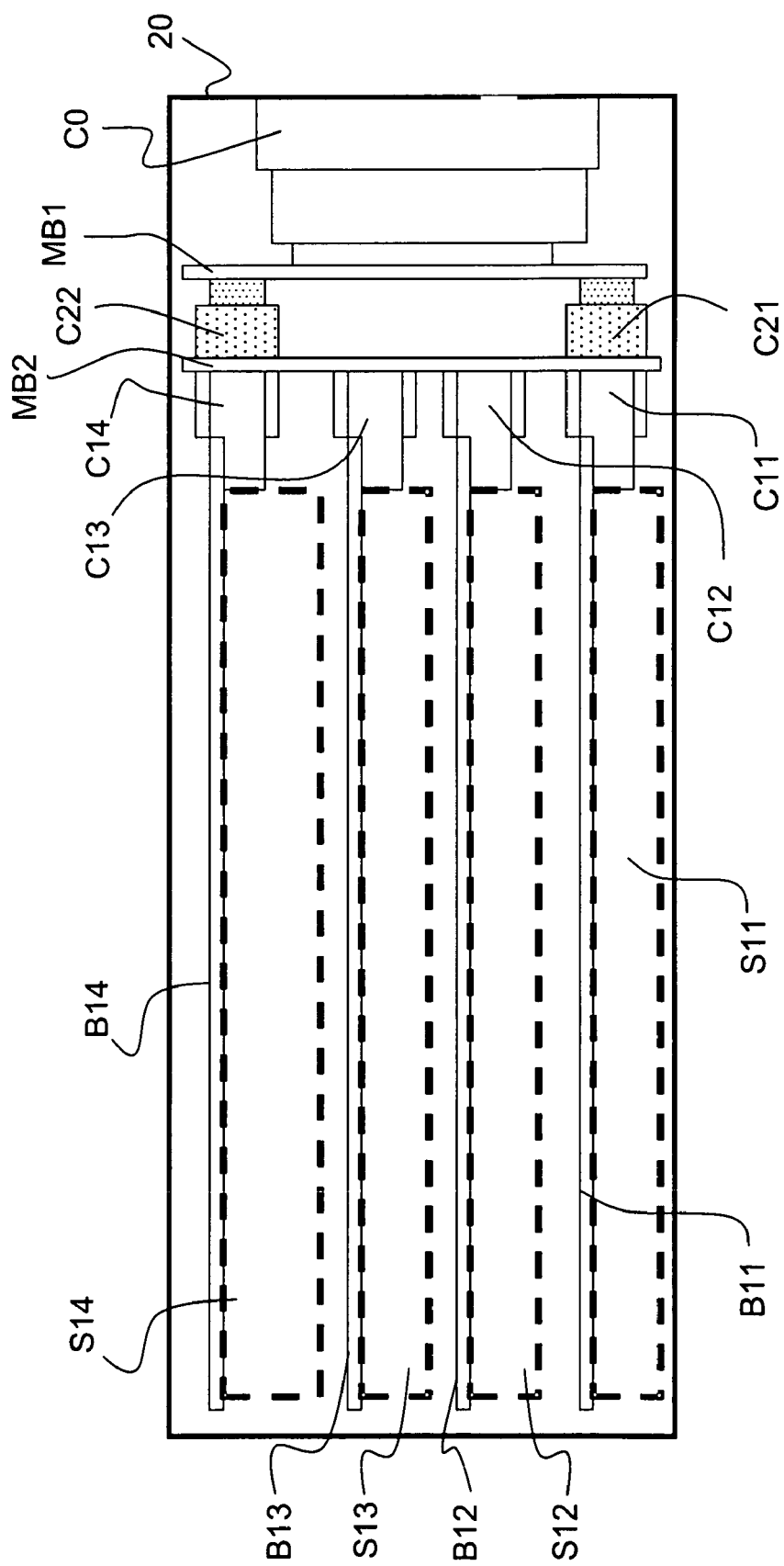
FIG. 1: the schematic section of an ARINC 600 computer with 3 MCU dimensions according to the prior art.

FIG. 1 shows a diagram corresponding to the prior art of an ARINC 600 computer with 3 MCU dimensions. The latter comprises a mechanical structure 20 one of the faces of which, called the front face, makes it possible to gain access to the circuit boards B1 to B4. These boards B1 to B4 are inserted vertically onto the "backplane" printed circuit MB2; the interconnection takes place via the connectors C11 to C14, for each of the boards, on a connection plane indistinguishable from or parallel to the plane of the boards in the inserted position and orthogonal to the "backplane" printed circuit MB2, the said connection plane being parallel to the direction of insertion of the circuit boards. For practical reasons relating notably to the degrees of liberty necessary for the connector technology of the four circuit boards B11 to B14, the "backplane" printed circuit MB2 rests on another printed circuit MB1 via two connectors C21 and C22. On the side of the face opposite to the front face, called the back face, the computer has the connector technology C0, of the ARINC 600 type in the example, allowing it to be interconnected with the outside.

Each circuit board B11 to B14 has a free space S11 to S14 necessary for the extraction and/or insertion of the boards, in which, for example, radiators may be placed for the purpose of dissipating the power inside the computer. These locations S11 to S14 are limited because of the need to be able to slide the boards relative to one another in order to insert them or extract them from the mechanical structure 20.

The object of the invention is to optimize the use of the volume of this type of computer with the aid of advances in electronics making it possible to reduce the surface area necessary for the electronic components and with the aid of a judicious layout of the elements of the said computer.

Figure 2:
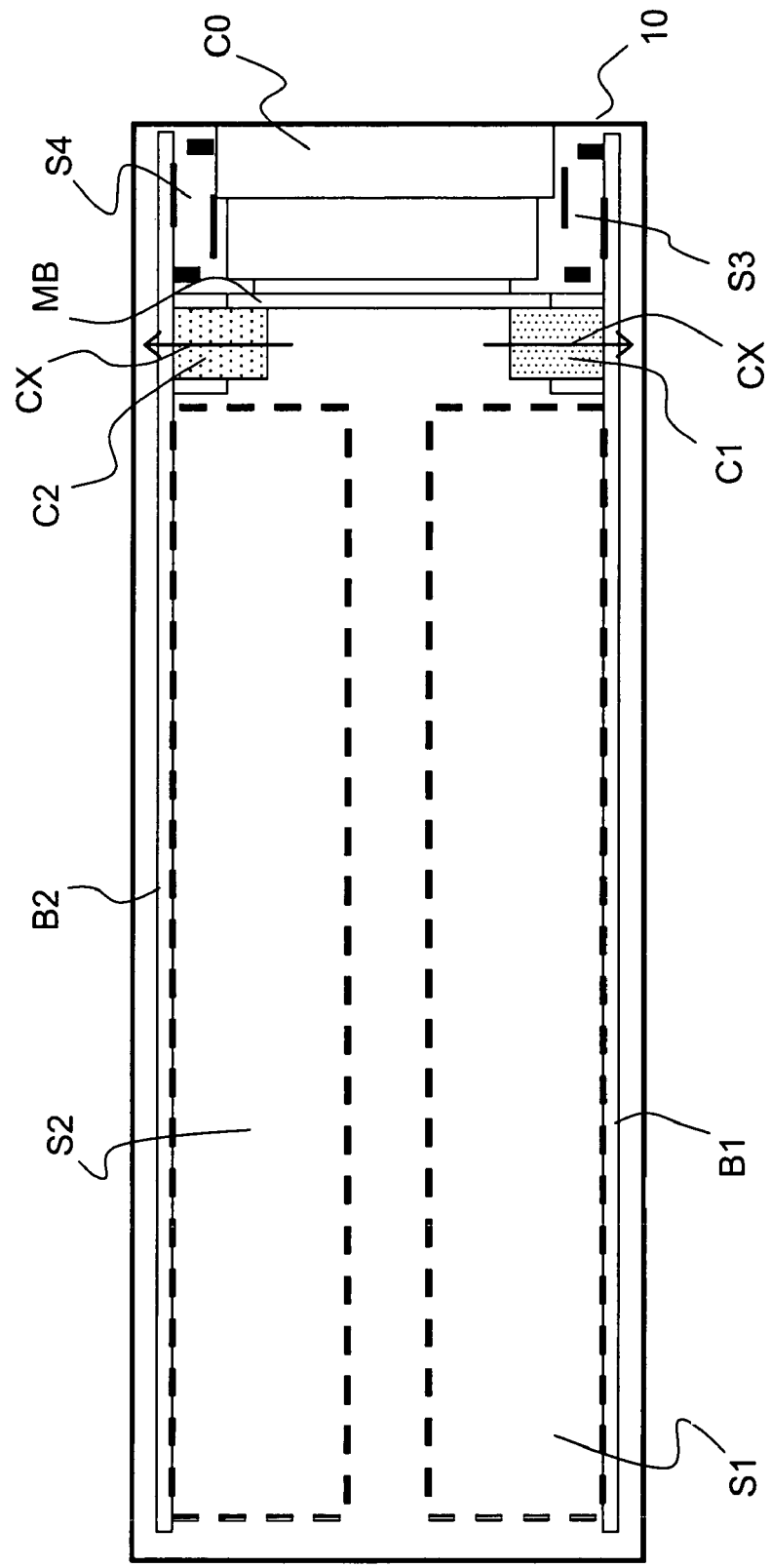
FIG. 2: the schematic section of an ARINC 600 computer according to the invention.

FIG. 2 illustrates the layout proposed by the invention for computers of reduced dimensions, of the ARINC 600 type. The latter comprises a mechanical structure 10, having a "belt" shape, and which will be detailed in FIG. 3. In this configuration, the connectors C1 and C2 of the "backplane" printed circuit MB make it possible to insert two circuit boards B1 and B2 which "close" the computer in the manner of two end panels. The connection is made in a plane CX orthogonal to the circuit boards B1-B2 and parallel to the "backplane" printed circuit. Compared with the circuit boards B11 to B14 of FIG. 1, the boards B1 and B2 have a much greater effective surface area: the surface area situated at the connectors C1 and C2 and, on either side of each of the boards, in the zones S3 and S4 represents a considerable gain making it possible to install more electronic components on each circuit board B1 and B2.

Furthermore, because of the advances made in electronics in the miniaturization of the components and an increase in their processing capacities, it becomes possible, for this type of computer, to perform all the electronic functions with the aid of only two boards. The immediate advantage lies in the fact that it is no longer necessary to have two levels of "backplane" printed circuits, MB1 and MB2 in FIG. 1. In this instance, the single "backplane" printed circuit MB of the computer is therefore connected to the connector technology C0, of the ARINC 600 type for example, allowing it to communicate with the outside.

However, developments in electronics also tend to increase the power to be dissipated per unit of volume for the computers and per unit of surface area for the circuit boards.

In the computer according to the invention shown in FIG. 2, it can be seen that the zones available for each of the boards B1 and B2 have been increased significantly. The circuit board B1 has the available zones S1 and S3 while the board B2 has the available zones S2 and S4. These considerable cleared volumes at the heart of the computer can be advantageously used for the cooling of the circuit boards B1 and B2, as will be explained in detail below. Furthermore, because of the lateral insertion and extraction of these boards, it is possible, in the event of occasional need, to modulate locally the distribution in thickness of the zones S1 and S2, being able to go in occasional and local extreme value as far as totally removing one of the two zones and taking the whole thickness from the other.

Figure 3:
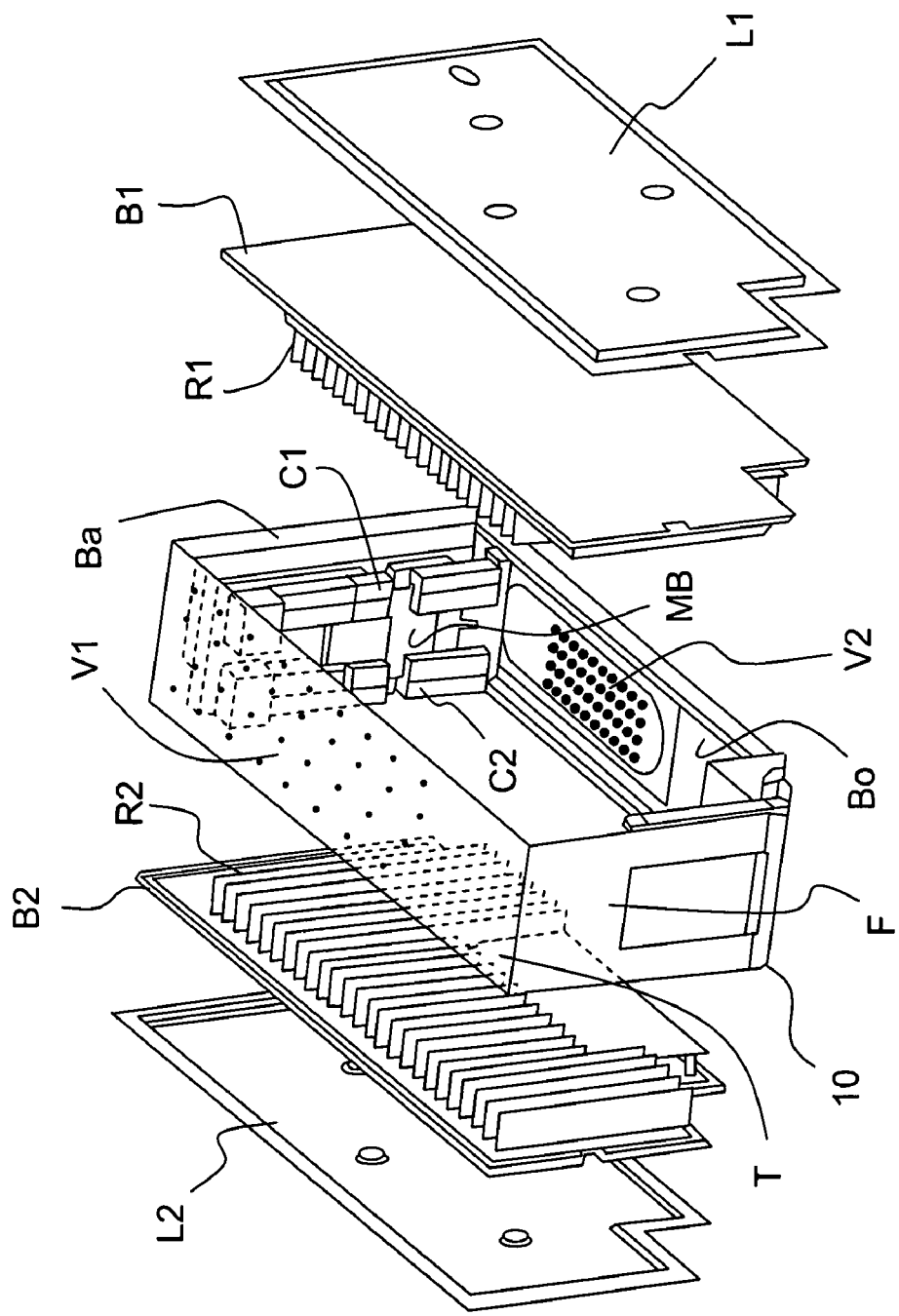
FIG. 3: the exploded view of an ARINC 600 computer according to the invention.

FIG. 3 represents an exploded view of a computer, such as an ARINC 600 computer, arranged according to the invention. Advantageously, the mechanical structure 10 has a "belt" shape, with a front face F, a back face Ba, a top face T, a bottom face Bo and two lateral faces which can be closed by covers L1 and L2. These covers L1 and L2 are designed to seal the computer; they are removable so as to allow easy access to the circuit boards B1 and B2. Faces may have orifices promoting ventilation, such as for example the top face T and the bottom face Bo which have ventilation orifices, respectively V1 and V2.

The "backplane" printed circuit MB, comprising the connectors C1 and C2, is situated on the side of the back face Ba. The connectors C1 and C2 are oriented towards the outside, that is to say towards the cover L1 for the connector C1 and towards the cover L2 for the connector C2. The connection of the circuit board B1 to the connector C1 of the "backplane" printed circuit MB is therefore carried out in a plane CX parallel to the said "backplane" printed circuit MB and orthogonal to the said circuit board B1. The same applies for the circuit board B2 on the connector C2.

In this manner, as shown in FIGS. 2 and 3, the surface area for accommodating electronic components is, for each of the boards, virtually equal to twice the lateral surface area of the computer, minus only the surface area of the connector C1 or C2. For an ARINC 600 computer, the gain is at least 80 square centimeters per board.

In addition, whereas in the prior art the circuit boards, B11 to B14 in FIG. 1, are usually held in place by simple slides, the circuit boards B1 and B2 may in this instance advantageously rest and be attached directly on the frame of the mechanical structure 10, the latter preferably comprising a shoulder promoting the adjustment of the said circuit boards B1 and B2. As a result of this, the heat exchanges between the circuit boards B1 and B2 and the mechanical structure 10 is optimized which eases the regulation of the temperature within the computer. Furthermore, it avoids a large proportion of the problems associated with the "fretting" phenomenon, meaning the corrosion of wear due to the relative movements of the connectors, due to holding the circuit boards B11 to B14 in place by direct contact on a vast surface area of the mechanical structure 10 of the computer.

Furthermore, it has been shown when describing FIG. 2 that the spaces available in the heart of the computer were very large, in particular the spaces S1 and S2. FIG. 3 shows large-dimensioned radiators, R1 for the board B1 and R2 for the board B2, designed to cool the said circuit boards B1 and B2. The comparison of the spaces S11 to S14 of FIG. 1 and S1 and S2 of FIG. 2 clearly shows the increased possibilities of dimensioning the radiators dedicated to regulating the temperature of the circuit boards B1 and B2 in the computer according to the invention and the flexibility in the local distribution of the thickness of each of the volumes S1 and S2, as explained above. Similarly, again by virtue of this large available volume S1 and S2, it is possible to opt for heat pipes connected to a heat exchanger situated on the front face F. In addition, on either side of each board B1 and B2, new spaces S3 and S4 capable of accommodating electronic components appear. In summary, the user has margins of manoeuvre and volume flexibility in three dimensions that are much greater than in the prior art for everything to do with the dissipation of power and the regulation of the temperature inside the computer according to the invention because more volume is available at the heart of the computer.

Figure 4:
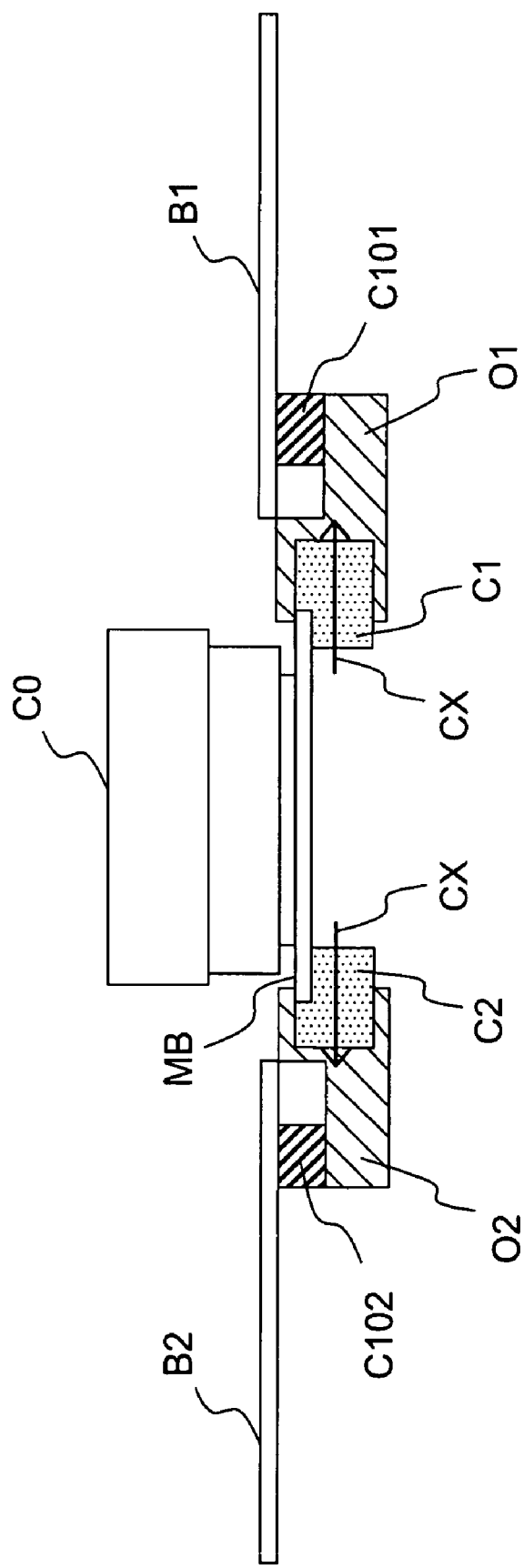
FIG. 4: the diagram of the tools interface allowing the computer according to the invention to be opened "butterfly-style"

FIG. 4 shows small tools O1 and O2 providing an additional advantage to the invention. These tools O1 and O2 comprise, on one side, a male connector technology allowing them to be connected to the connectors C1 and C2 of the "backplane" printed circuit MB. They are bent, preferably at 90°, and have connectors C101 and C102 making it possible to connect the circuit boards B1 and B2 on connection planes orthogonal to the "backplane" printed circuit MB, the circuit boards B1 and B2 being parallel to the said "backplane" printed circuit MB. This opening, called "butterfly-style", of the computer eases access to the circuit boards B1 and B2 for any maintenance operation.

Figure 5:
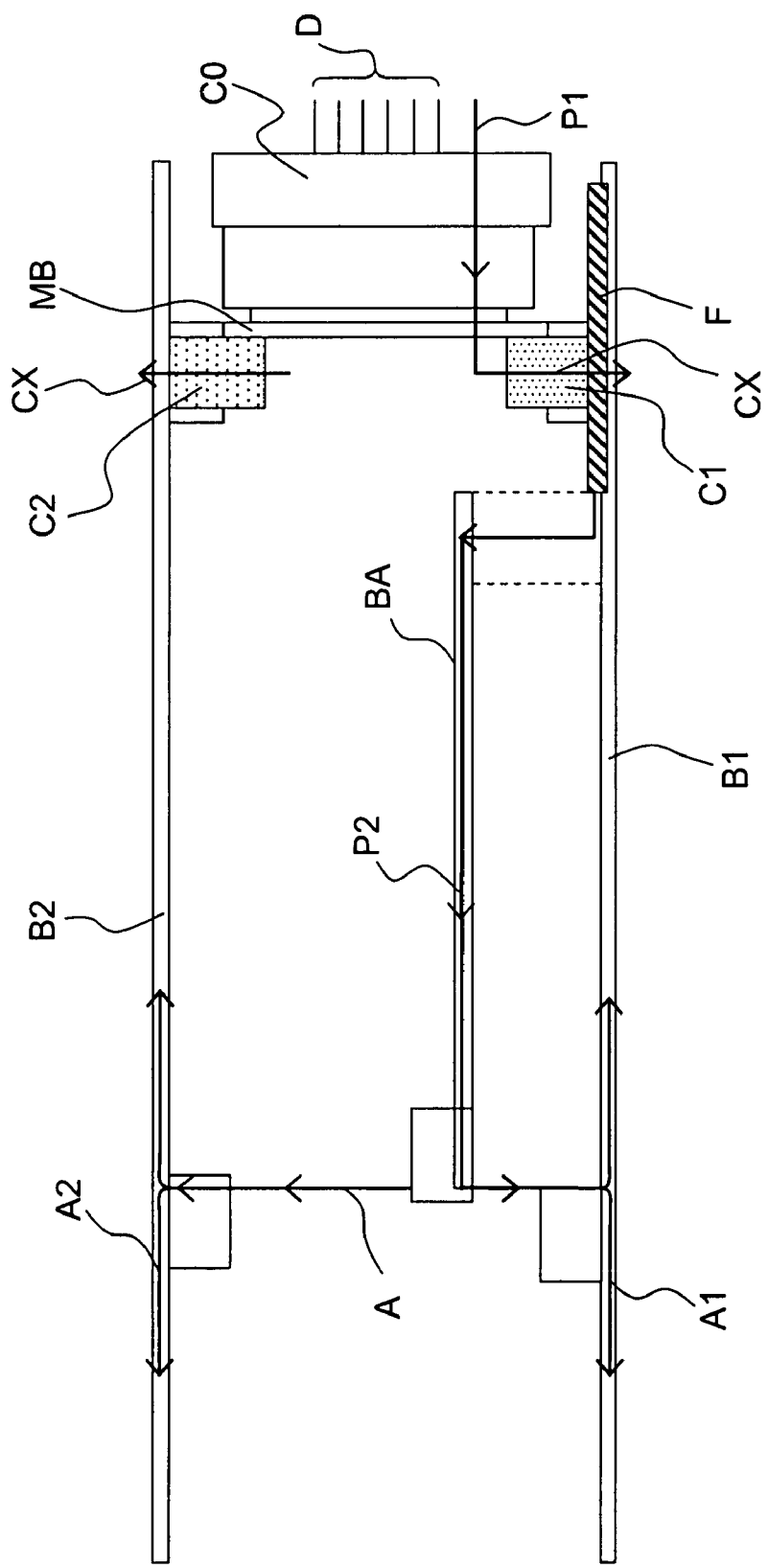
FIG. 5: the diagram of a computer according to the invention comprising a judiciously positioned power supply board.

The diagram in FIG. 5 reflects an advantage as a result of the invention. The inside of a computer according to the invention is in this instance represented, for simplification purposes, without the mechanical structure 10 of FIGS. 2 and 3. Data D are interchanged between the outside and the computer via the connection technology C0. The circuit boards B1 and B2 are inserted into the connectors C1 and C2 of the "backplane" printed circuit MB on connection planes CX parallel to the said "backplane" printed circuit MB, as has already been described above. The power supply reaches the computer in the form of a "dirty" power signal P1. Via the "backplane" printed circuit MB, it reaches the circuit board B1 where it passes through a series of filters and protections in the zone F of the circuit board B1. The voltage is then typically 28 volts. The power finally reaches a power supply board BA, that is easy to insert in the heart of the computer thanks to the volume available between the two circuit boards B1 and B2. It is there processed and transformed. A "clean" power signal P2 can then be routed as a power supply A of the circuit boards B1 and B2. The voltage is then typically 3.3 volts. The board B1 is supplied by a voltage A1, the board B2 by a voltage A2. The layout of the computer according to the invention greatly facilitates the electric wiring described here. Specifically, in a computer according to the prior art, it is necessary for the power supply to again pass through the "backplane" printed circuit MB1 in order to supply all the circuit boards B11 to B14, which results in an increase in the length of the electric wiring, and therefore an increase in the risks of short circuits, interference, heating, etc.

In summary, the layout of a computer with modest dimensions, typically 3 MCU, according to the invention has many immediate or indirect advantages. In the first place, the invention has the advantage of allowing optimization of the use of the volume of the computers allowing a very significant increase in the capacity and the limits of the volume density, surface density and one-off dissipated power. The surface area for accommodating electronic components on one board is greatly increased and, heat control is made easier and better. In addition, the use of additional tools allowing the computer to be opened "butterfly-style" makes maintenance operations on the circuit boards easier. Finally, the layout of the computer according to the invention makes it possible to minimize the length of electric wiring necessary to supply the circuit boards from a power supply board placed in the heart of the computer. In certain cases, the invention also makes it possible to optimize the flow and segregation of the signals between highly disrupted input signals and sensitive and clean internal signals.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A computer comprising:
a mechanical, metallic or composite structure; and
a circuit board insertable to the mechanical structure;
wherein said mechanical structure includes
   a backplane printed circuit situated inside the mechanical structure;
   a connector oriented towards outside of the computer relative to the backplane printed circuit for connecting the circuit board to the backplane printed circuit,
wherein
   said connector comprises means for ensuring the connection of the circuit board on a connection plane between the circuit board and the backplane printed circuit parallel to the backplane printed circuit,
   said connection plane is parallel to direction of inserting said circuit board to the mechanical structure, and
   the backplane printed circuit is orthogonal to the said circuit board when said circuit board is inserted in the mechanical structure.

2. The computer according to claim 1, further comprising another circuit board connectable to another connector of said mechanical structure, wherein said another connector is oriented towards the outside of the computer relative to the backplane printed circuit and the mechanical structure is closed by said circuit boards defining end panels of the mechanical structure.

3. The computer according to claim 1, wherein the mechanical structure has a top face and a bottom face opposite to the top face, the top face and bottom face having ventilation orifices.

4. The computer according to claim 1, wherein said circuit board is attached to a shoulder secured to the mechanical structure.

5. The computer according to claim 4, further comprising a contact surface located between the circuit board and the mechanical structure, ensuring an effective thermal coupling between said circuit board and said mechanical structure.

6. The computer according to claim 1, further comprising two covers on opposite sides of the mechanical structure for sealing the computer.

7. The computer according to claim 1, comprising a tools interface configured to be inserted between the connector of the backplane printed circuit and the circuit board for allowing the computer to be opened butterfly-style.

8. The computer according to claim 1, comprising elements provided in a center of the computer for cooling the circuit board.

9. The computer according to claim 5, comprising elements provided in a center of the computer for cooling the circuit board.

10. The computer according to claim 8, wherein said elements for cooling the circuit board are radiators that are configured to be supplemented by elements for stirring air, in the same volume, thereby enhancing effectiveness of the said radiators.

11. The computer according to claim 8, wherein said elements for cooling the circuit board are heat ducts connected to a heat exchanger situated on a front face of the mechanical structure.

12. The computer according to claim 2, further comprising a power supply board placed in a center of the computer for supplying voltage to the circuit boards, said voltage traveling only once through the backplane printed circuit to reduce a length of an electric wiring.

13. The computer according to claim 1 has a parallelepipedal shape that includes a front face, a back face opposite to the front face, a top face, a bottom face opposite to the top face and two lateral faces.

14. The computer to claim 13, has a reduced width compatible with an arrangement with board insertion from the side, wherein the reduced width is approximately 9 centimeters in the case of a 3 MCU computer.

* * * * *